United States Patent
Puygranier et al.

(10) Patent No.: US 10,598,686 B2
(45) Date of Patent: Mar. 24, 2020

(54) MICROMECHANICAL Z-ACCELERATION SENSOR

(71) Applicant: Robert Bosch GmbH, Stuttgart (DE)

(72) Inventors: Antoine Puygranier, Asperg (DE);
Denis Gugel, Dusslingen (DE);
Guenther-Nino-Carlo Ullrich,
Reutlingen (DE); **Markus
Linck-Lescanne**, Wannweil (DE);
Sebastian Guenther, Tuebingen (DE);
Timm Hoehr, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 214 days.

(21) Appl. No.: 15/785,891

(22) Filed: Oct. 17, 2017

(65) Prior Publication Data

US 2018/0106828 A1    Apr. 19, 2018

(30) Foreign Application Priority Data

Oct. 19, 2016    (DE) .................. 10 2016 220 510

(51) Int. Cl.
*G01P 15/08*    (2006.01)
*B81C 1/00*    (2006.01)
*G01P 15/03*    (2006.01)

(52) U.S. Cl.
CPC .......... *G01P 15/03* (2013.01); *B81C 1/00333* (2013.01); *G01P 15/0802* (2013.01); *B81B 2201/0235* (2013.01); *B81C 2203/0145* (2013.01); *G01P 2015/0831* (2013.01)

(58) Field of Classification Search
CPC ............. G01P 15/03; G01P 2015/0831; B81C 2203/0145; B81B 2201/0235
USPC ............................................. 73/628
See application file for complete search history.

(56) References Cited

U.S. PATENT DOCUMENTS

| | | | |
|---|---|---|---|
| 8,402,826 B2 * | 3/2013 | Classen | G01P 15/0802 73/514.32 |
| 10,294,095 B2 * | 5/2019 | Pekka Herzogenrath | B81B 3/0008 |
| 2008/0087085 A1 | 4/2008 | Ueda et al. | |
| 2010/0107763 A1 | 5/2010 | Lin et al. | |
| 2010/0175473 A1 * | 7/2010 | Classen | G01P 15/125 73/514.29 |
| 2011/0296917 A1 * | 12/2011 | Reinmuth | B81C 99/0045 73/514.32 |
| 2012/0186346 A1 | 7/2012 | McNeil et al. | |
| 2013/0167637 A1 * | 7/2013 | Bertini | G01C 19/5712 73/504.12 |
| 2013/0192362 A1 | 8/2013 | Rytkonen | |
| 2013/0285166 A1 * | 10/2013 | Classen | B81C 1/00246 257/415 |
| 2014/0331770 A1 | 11/2014 | Jourdan et al. | |
| 2015/0143907 A1 * | 5/2015 | Ullrich | B81B 3/0051 73/514.32 |

* cited by examiner

*Primary Examiner* — Jacques M Saint Surin
(74) *Attorney, Agent, or Firm* — Norton Rose Fulbright US LLP; Gerard Messina

(57) ABSTRACT

A micromechanical z-acceleration sensor, including a seismic mass element including a torsion spring; the torsion spring including an anchor element, with the aid of which the torsion spring is connected to a substrate; the torsion spring being connected at both ends to the seismic mass element with the aid of a bar-shaped connecting element designed as normal with respect to the torsion spring in the plane of the seismic mass element.

10 Claims, 3 Drawing Sheets

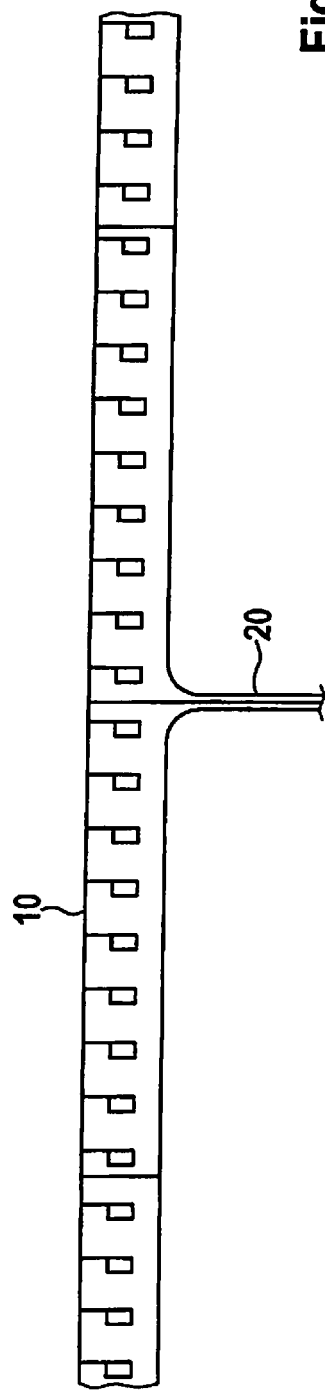
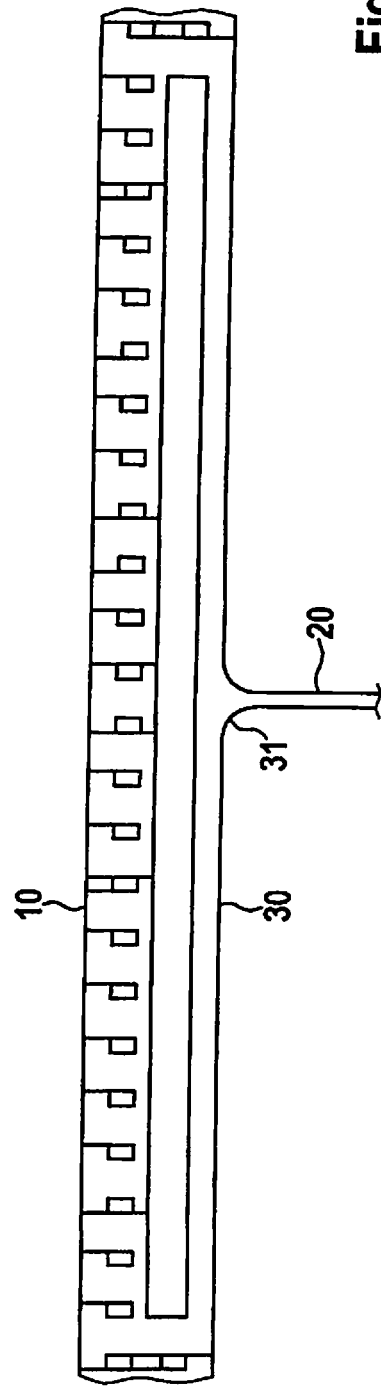

MICROMECHANICAL Z-ACCELERATION SENSOR

CROSS REFERENCE

The present application claims the benefit under 35 U.S.C. § 119 of German Patent Application No. DE 102016220510.2 filed on Oct. 19, 2016, which is expressly incorporated herein by reference in its entirety.

FIELD

The present invention relates to a micromechanical z-acceleration sensor. The present invention also relates to a method for manufacturing a micromechanical z-acceleration sensor.

BACKGROUND INFORMATION

U.S. Patent Application Publication No. 2008/0087085 A1 describes a MEMS sensor having free fall self-test capability, springs which are resilient in three directions orthogonal to one another being provided for a self-test actuator of a transducer.

U.S. Patent Application Publication No. 2010/0107763 A1 describes a transducer having a decoupled sensing capability in directions orthogonal to one another. For this purpose, an anchor system is provided including spring elements which enable a mass to be deflected in the x-direction and the y-direction.

U.S. Patent Application Publication No. 2012/0186346 A1 describes a MEMS sensor including folded torsion springs.

U.S. Patent Application Publication No. 2014/0331770 A1 describes a mechanical connection which forms a pivotal point for MEMS and NEMS mechanical structures.

U.S. Patent Application Publication No. 2013/0192362 A1 describes a vibration-tolerant acceleration sensor structure.

SUMMARY

An object of the present invention is to provide an improved micromechanical z-acceleration sensor.

The object may be achieved according to a first aspect of an example embodiment of the present invention by providing a micromechanical z-acceleration sensor, including:
  a seismic mass element including a torsion spring;
  the torsion spring including an anchor element, by way of which the torsion spring is connected to a substrate;
  the torsion spring being connected at both ends to the seismic mass element with the aid of a bar-shaped connecting element designed as normal with respect to the torsion spring in the plane of the seismic mass element.

As a result, during great loads, at least a portion of mechanical deformation energy is advantageously absorbed by the connecting element. Fewer breakages of torsion springs over the period of operation of the micromechanical z-acceleration sensor are advantageously achievable as a result. Advantageously, no disadvantageous effects on a motion characteristic of the z-acceleration sensor in the xy-plane are effectuated with the aid of the specific connection of the torsion spring to the seismic mass.

According to a second aspect of the present invention, the object may be achieved by providing a method for manufacturing a micromechanical z-acceleration sensor, including the steps:
  forming a seismic mass element including a torsion spring;
  anchoring the torsion spring on a substrate with the aid of an anchor element;
  the torsion spring being connected to the seismic mass element at both ends with the aid of a connecting element at each end, the connecting element being designed in the shape of a bar and normal with respect to the torsion spring in the plane of the seismic mass element.

Preferred specific embodiments of the micromechanical z-acceleration sensor are described herein.

One advantageous refinement of the micromechanical z-acceleration sensor is characterized in that the torsion spring is specifically softer than the connecting element and the connecting element is specifically softer than the seismic mass element. In this way, favorable rigidity ratios are provided for the individual elements of the micromechanical z-acceleration sensor, which effectuate favorable operation characteristics during great mechanical loads.

Another advantageous refinement of the micromechanical z-acceleration sensor provides that a width of the connecting element is approximately 2 µm to approximately 5 µm. In this way, the connecting element is designed specifically to be more rigid than the torsion spring.

Yet another advantageous design of the micromechanical z-acceleration sensor provides that a length of the connecting element is approximately 100 µm to approximately 200 µm. In this way as well, the connecting element is designed specifically to be more rigid than the torsion spring.

Yet another advantageous design of the micromechanical z-acceleration sensor is characterized in that dimensions of the connecting element are ascertained with the aid of a simulation method. In this way, methods which are known per se and which have been proven may be utilized for the precise dimensioning of dimensions of the connecting element, for example in the form of finite element methods.

One further advantageous refinement of the micromechanical z-acceleration sensor is characterized in that transition areas between the torsion spring and the connecting element are specifically designed as rounded. In this way, support is advantageously provided for ensuring that a risk of breakage for the micromechanical torsion spring is minimized.

Yet another advantageous refinement of the micromechanical z-acceleration sensor is characterized in that the connecting element is designed integrally with the seismic mass element and the torsion spring. In this way, manufacturing processes for micromechanics may be utilized for manufacturing the connecting element for the torsion spring.

The present invention is described in detail in the following, including further features and advantages, on the basis of multiple figures. The figures are used primarily for basically describing the present invention and are not necessarily drawn true to scale. For the sake of greater clarity, it may be provided that not all reference numerals are shown in all the figures.

Described method features similarly result from corresponding described product features, and vice versa. This means, in particular, that features, technical advantages, and embodiments related to the micromechanical z-acceleration sensor similarly result from corresponding embodiments, features, and advantages related to the method for manufacturing a micromechanical z-acceleration sensor, and vice versa.

BRIEF DESCRIPTION OF THE DRAWINGS

FIG. 2 shows an enlarged view of the arrangement from FIG. 1.

FIG. 3 shows a top view of one specific embodiment of a suggested micromechanical z-acceleration sensor.

DETAILED DESCRIPTION OF EXAMPLE EMBODIMENTS

Conventional micromechanical z-acceleration sensors including a detection direction which is out-of-plane (in the z-direction) typically have a rocker structure of an asymmetrically designed, seismic mass element which is twistable about a torsion axis ("z-rocker"). In this case, a torsion spring is directly connected to a frame of the seismic mass element without elements—which may contribute to a reduction in mechanical stress—located therebetween.

In accordance with the present invention, a micromechanical z-acceleration sensor is provided which is improved with respect to great mechanical loads.

Figure 1:
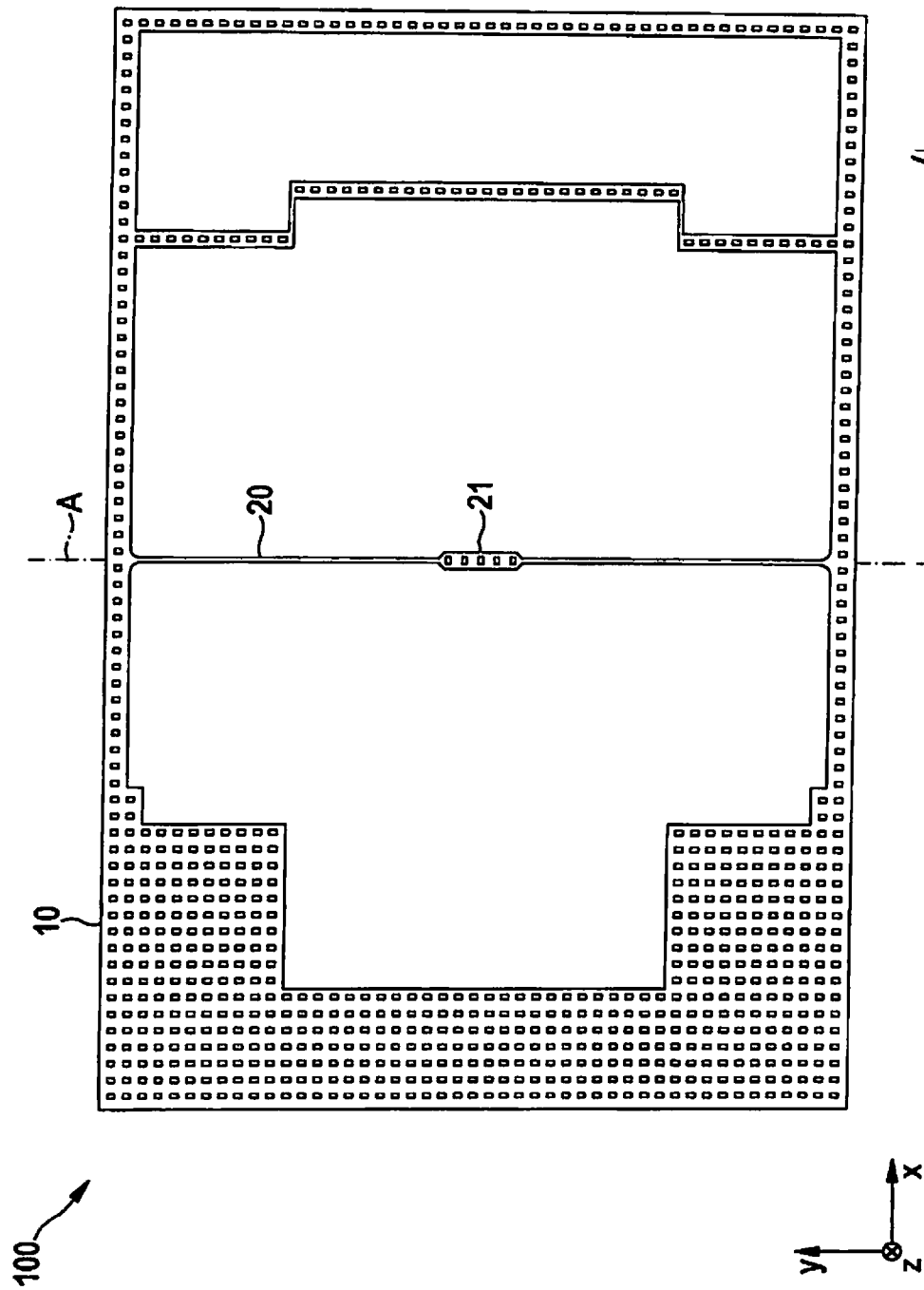
FIG. 1 shows a top view of a conventional micromechanical z-acceleration sensor.

FIG. 1 shows a top view of a seismic mass element 10 for a conventional micromechanical acceleration sensor 100, torsion spring 20 being designed to be twistable about a torsion axis A. Torsion spring 20 is anchored to an underlying substrate (not shown) via an anchor element 21. For the sake of greater clarity, further necessary elements of the z-acceleration sensor such as, for example, detection electrodes, evaluation electronics, housing, etc., are not represented in FIG. 1 and thereafter.

In the end, a rocker structure for a z-sensor element, which is usually asymmetrically designed, is therefore provided so that, in this way, during an acceleration in the z-direction, a deflection of the rocker structure out of the plane may be effectuated and an acceleration acting in the z-direction may be detected. A Cartesian coordinate system is represented in FIG. 1 in order to describe coordinates.

Conventional torsion spring 20 may sustain damage and, in the extreme case, may even break during great loads due to the fact that the torsion spring is connected directly, i.e., "a hard connection," to seismic mass element 10.

FIG. 2 shows an enlarged detailed view of conventional micromechanical z-acceleration sensor 100 from FIG. 1. It is apparent that torsion spring 20 is directly connected to a frame of seismic mass element 10.

FIG. 3 shows a top view of a portion of a suggested micromechanical z-acceleration sensor 100. It is apparent that it is provided to connect torsion spring 20 to seismic mass element 10 via a bar-shaped connecting element 30. In this way, a gap-like section forms in a side area of seismic mass element 10 at each of the two ends of torsion spring 20. For the sake of greater clarity, only one end section of torsion spring 20 is represented in FIG. 3, the other end of torsion spring 20 being connected to seismic mass element 10 in the same way as the represented end.

In this way, support is provided for ensuring that, in the case of great force effects on micromechanical z-acceleration sensor 100, connecting element 30 absorbs at least a portion of the resultant mechanical energy and is correspondingly deflected as a result. Torsion spring 20 may therefore be advantageously protected against excessive loads and, therefore, may possibly be protected against damage as a result.

Figure 4:
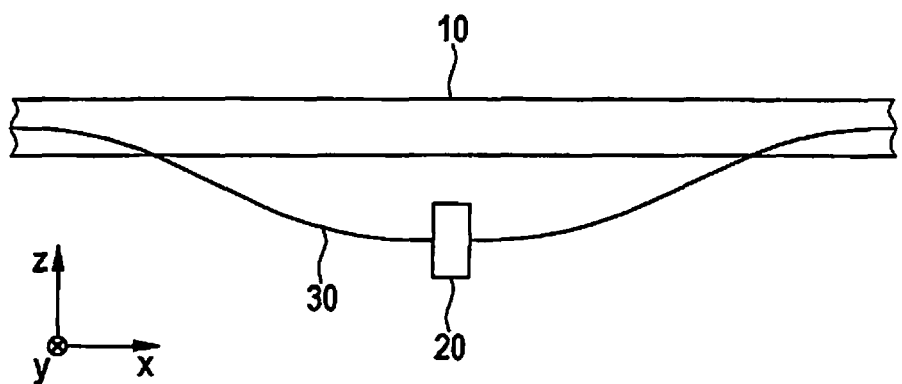
FIG. 4 shows a basic function diagram for describing a mode of operation of the suggested connecting element for a torsion spring.

In FIG. 4, a cross sectional view qualitatively points in the direction of the plane of seismic mass element 10. It is apparent that bar-shaped connecting element 30 is arcuately deflected during a great load of micromechanical z-acceleration sensor 100 in the z-direction.

It has been proven that an advantageous length dimension of connecting element 30 is approximately 100 µm to approximately 200 µm, i.e., approximately 50 µm to approximately 100 µm on each side of the torsion spring. A width of the connecting element is preferably approximately 2 µm to approximately 5 µm. In this case, conventional simulation methods (for example, finite element methods) may be utilized for the precise dimensioning.

Preferably, a mechanical rigidity of connecting element 30 is greater than a rigidity of torsion spring 20 and a rigidity of seismic mass element 10 is greater than a rigidity of connecting element 30. In this way, torsion spring 20 represents the softest element. In this way, a homogeneous absorption of energy by connecting element 30 is supported during a great force effect (for example, during a drop event of a mobile terminal including the micromechanical z-acceleration sensor).

Preferably, transition areas 31 between torsion spring 20 and connecting element 30 each include a section having a defined radius of curvature. As a result, mechanical notch stresses between torsion spring 20 and the connecting element may be advantageously reduced and, as a result, a risk of breakage for micromechanical torsion spring 20 may be reduced.

Advantageously, it is possible to manufacture torsion spring 20 as one piece or integrally with connecting element 30 and seismic mass element 10 using common conventional micromechanical methods (for example, gas phase etching).

Advantageously, the suggested micromechanical z-acceleration sensor may be utilized in applications in the automotive sector (for example, for sensors for ESP control units) or in mobile terminals.

One further advantageous specific embodiment of suggested micromechanical z-acceleration sensor 100 which includes a connecting element 30 having, for example, a meandering shape, is not represented in figures. In this way, the connection of torsion spring 20 to seismic mass element 10 may be specifically designed as softer than in the arrangement from FIG. 3.

Advantageously, a spring suspension which allows for more freedom of movement in the out-of-plane direction is provided via suggested micromechanical mass element 10. A connection of torsion spring 20 to an exposed web or bar which is not connected to the substrate, is situated perpendicularly with respect to torsion spring 20, and is formed in the plane of seismic mass element 10, is implemented as a result. With the aid of this "suspension unit", mechanical stress in torsion spring 20 may be reduced when seismic mass element 10 is moved upward or downward. Advantageously, an in-plane rigidity of seismic mass element 10 is not substantially reduced due to this specific connection of torsion spring 20 to seismic mass element 10.

Figure 5:
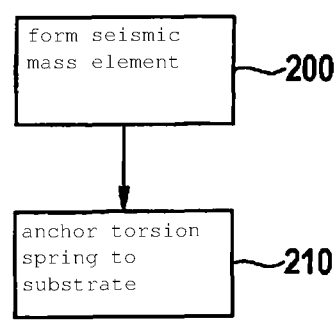
FIG. 5 shows a basic flow chart of a method for manufacturing a micromechanical z-acceleration sensor.

FIG. 5 shows a schematically represented sequence of a method for manufacturing a micromechanical z-acceleration sensor.

A formation of seismic mass element 10 including a torsion spring 20 is carried out in a step 200.

In a step 210, an anchoring of torsion spring 20 to a substrate with the aid of an anchor element 21 is carried out, torsion spring 20 being connected to seismic mass element 10 at both ends with the aid of a connecting element 30 at each end, connecting element 30 being formed in the plane of seismic mass element 10 in the shape of a bar and as normal with respect to torsion spring 20.

In summary, an advantageous design for a micromechanical z-acceleration sensor is provided by way of the present invention.

Although the present invention has been described above on the basis of preferred specific embodiments, it is by no means limited thereto.

Those skilled in the art will therefore suitably modify the features and combine them with one another without departing from the core of the present invention.

What is claimed is:

1. A micromechanical z-acceleration sensor, comprising:
    a seismic mass element including a torsion spring, the torsion spring including an anchor element, with the aid of which the torsion spring is connected to a substrate;
    wherein the torsion spring is connected at both ends to the seismic mass element with the aid of a bar-shaped connecting element designed as normal with respect to the torsion spring in the plane of seismic mass element, the bar-shaped connecting element being situated between the torsion spring and the seismic mass, an empty gap being between the bar-shaped connecting element and the seismic mass at each of the ends of the torsion spring.

2. The micromechanical z-acceleration sensor as recited in claim 1, wherein the torsion spring is softer than the connecting element and the connecting element is softer than the seismic mass element.

3. The micromechanical z-acceleration sensor as recited in claim 1, wherein a width of the connecting element is approximately 2 μm to approximately 5 μm.

4. The micromechanical z-acceleration sensor as recited in claim 1, wherein a length of the connecting element is approximately 100 μm to approximately 200 μm.

5. The micromechanical z-acceleration sensor as recited in claim 1, wherein dimensions of the connecting element are ascertained with the aid of a simulation method.

6. The micromechanical z-acceleration sensor as recited in claim 1, wherein transition areas between the torsion spring and the connecting element are rounded.

7. The micromechanical z-acceleration sensor as recited in claim 1, wherein the connecting element is integral with the seismic mass element and the torsion spring.

8. A method for manufacturing a micromechanical z-acceleration sensor, comprising:
    forming a seismic mass element including a torsion spring;
    anchoring the torsion spring on a substrate with the aid of an anchor element, the torsion spring being connected to the seismic mass element at both ends with the aid of a connecting element at each end, the connecting element being in the shape of a bar and normal with respect to the torsion spring in the plane of the seismic mass element, the bar-shaped connecting element being situated between the torsion spring and the seismic mass, an empty gap being between the bar-shaped connecting element and the seismic mass at each of the ends of the torsion spring.

9. The method as recited in claim 8, wherein the connecting element is integral with the seismic mass element and the torsion spring.

10. The method as recited in claim 8, wherein the torsion spring is softer than the connecting element and the connecting element is softer than the seismic mass element is formed to be.

* * * * *